//  US006922103B2

(12) United States Patent
Cheung et al.

(10) Patent No.: US 6,922,103 B2
(45) Date of Patent: Jul. 26, 2005

(54) METHOD AND APPARATUS FOR LOW INTERMODULATION DISTORTION AMPLIFICATION IN SELECTED BANDS

(75) Inventors: Peter Y. Cheung, Chino Hills, CA (US); David L. Crampton, Rossmoor, CA (US); Jennifer Y. Vollbrecht, Torrance, CA (US); Kuang Yung Liu, Los Angeles, CA (US); Lauriston Chin Wah, Manhattan Beach, CA (US)

(73) Assignee: The Boeing Company, Chicago, IL (US)

( * ) Notice: Subject to any disclaimer, the term of this patent is extended or adjusted under 35 U.S.C. 154(b) by 42 days.

(21) Appl. No.: 10/442,596

(22) Filed: May 21, 2003

(65) Prior Publication Data

US 2004/0232983 A1 Nov. 25, 2004

(51) Int. Cl.[7] .................................................. H03F 1/26
(52) U.S. Cl. ........................................ 330/149; 330/151
(58) Field of Search .................................. 330/149, 151; 375/296, 297; 455/63

(56) References Cited

U.S. PATENT DOCUMENTS 6,587,514 B1 * 7/2003 Wright et al. ............... 375/296
6,657,493 B2 * 12/2003 Ode et al. ................... 330/149
6,717,464 B2 * 4/2004 Fudaba et al. .............. 330/149

OTHER PUBLICATIONS

Jacky S. Chow et al., "Mitigating Clipping Noise in Multi-carrier Systems," IEEE, 1997, pp 715–719.
R. O'Neill et al., "Envelope Variations and Spectral Splatter in Clipped Multicarrier Signals," IEEE, 1995, pp 71–75.
Mathias Pauli et al., "On the Reduction of the Out-of-Band Radiation of OFDM-Signals," IEEE, 1998, pp 1304–1308.

* cited by examiner

Primary Examiner—Henry Choe
(74) Attorney, Agent, or Firm—Gates & Cooper LLP

(57) ABSTRACT

A method and apparatus for reducing intermodulation distortion is disclosed. In one embodiment, the method comprises the steps of accepting a sampled input signal V(t) wherein the input signal V(t) comprises a plurality of peaks; determining n peaks $V_{p_1}, V_{p_2}, \ldots V_{p_n}$ of the sampled input signal V(t) exceeding a clip value $V_{clip}$ at times $t_1, t_2, \ldots t_n$; and modifying the sampled input signal V(t) by weighting the n peaks $V_{p_1}, V_{p_2}, \ldots, V_{p_n}$ exceeding the clip value $V_{clip}$ of the sampled input signal V(t) by a function b(t) wherein b(t) is either a hard limiting function or $b(t)=f(a_1, a_2, \ldots a_n; t-t_{p_1}, t-t_{p_2}, \ldots t-t_{p_n})$, wherein $a_1, a_2, \ldots a_n$ are weight values corresponding to the n peaks $V_{p_1}, V_{p_2}, \ldots V_{p_n}$, and $f(t-t_{p_1}, t-t_{p_2}, \ldots t-t_{p_n})$ is a smooth shaping function. Intermodulation performance is then selectively improved in selected sub-bands by notch filtering prior to application to the non-linearity.

30 Claims, 15 Drawing Sheets

METHOD AND APPARATUS FOR LOW INTERMODULATION DISTORTION AMPLIFICATION IN SELECTED BANDS

BACKGROUND OF THE INVENTION

1. Field of the Invention

The present invention relates to systems and methods for signal processing, and in particular to a system and method for reducing intermodulation distortion.

2. Description of the Related Art

It is sometimes advantageous to combine a plurality of signals, each having its own carrier, to create a multi-carrier signal. Unfortunately, multi-carrier signals often have high peak-to-average power ratios. When such a multi-carrier signal is subjected to a peak—limiting channel (such as a non-linear power amplifier) the signals (and its components) undergo significant spectral distortion, leading to both in-band and out-of-band interference. This interference can cause significant degradation in system performance.

Methods have been developed to decrease the interference resulting from applying signals having high peak-to-average power ratios to nonlinear amplifiers (including those with a clipping or saturation point).

One technique to reduce the effect of the non-linearity is to back off the output signal level from the amplifier's saturation point. While effective, this reduces the transmitted signal power and overall power efficiency, thereby significantly increasing the complexity of the thermal control and power subsystems.

A second technique is to use feed-forward and feedback amplifier techniques. Feed forward techniques provide excellent correction and bandwidth, but again with additional hardware and significant DC power and thermal control design. Feedback techniques are inherently narrow band, and therefore less suitable for wide bandwidth applications.

A third technique involves pre-distorting the input signal. Representative examples of the application of this technique are described in Chow, JS., Bingham, J. A. C., and Flowers, M. S., "Mitigating Clipping Noise in Multi-Carrier Systems," Communications, 1997. ICC 97 Montreal, at 1997 IEEE International Conference on Communications: Towards the Knowledge Millennium, Vol. 2 , 1997, pp. 715–719; O'Neill, R., Lopes, L. B., "Envelope Variation and Spectral Splatter in Clipped Mulit-Carrier Signals", Personal, Indoor and Mobile Communications, 1995. PRMC'95. 'Wireless: Merging on into the Information SuperHighway'., Sixth International Symposium on, Volume: 1, Pages 71–75, 1995; and Pauli, M. and Kuchenbecker, P., "on the Reduction of the Out-of-Band Radiation of OFDM-Signals," Conference Record, 1998 IEEE International Conference on Communications, Vol. 3, 1998, pp1304–1308, which are incorporated by reference herein. However, while the techniques described in these publications are effective in reducing distortion levels across the entire frequency band, they typically do not reduce distortion to sufficiently low levels. What is needed is a system and method for reducing intermodulation distortion that produces very low distortion levels in sub-bands of interest.

The present invention satisfies that need.

SUMMARY OF THE INVENTION

To address the requirements described above, the present invention discloses a method and apparatus for reducing intermodulation distortion. In one embodiment, the method comprises the steps of accepting a sampled input signal V(t) wherein the input signal V(t) comprises a plurality of peaks; determining n peaks $V_{p_1}, V_{p_2}, \ldots, V_{p_n}$ of the sampled input signal V(t) exceeding a clip value $V_{clip}$ at times $t_1, t_2, \ldots, t_n$; and modifying the sampled input signal V(t). The sampled input signal V(t) is modified by weighting the n peaks $V_{p_1}, V_{p_2}, \ldots, V_{p_n}$ exceeding the clip value $V_{clip}$ of the sampled input signal V(t) by a function b(t). In one embodiment, b(t) is a hard limiting function that pre-clips the n peaks. In another embodiment, $b(t) = f(a_1, a_2, \ldots a_n; t-t_{p_1}, t-t_{p_2}, \ldots t-t_{p_n})$, wherein $a_1, a_2, \ldots a_n$ are weight values corresponding to the n peaks $V_{p_1}, V_{p_2}, \ldots V_{p_n}$, and $f(t-t_{p_1}, t-t_{p_2}, \ldots t-t_{p_n})$ is a smooth shaping function. Intermodulation performance is then selectively improved in selected sub-bands by notch filtering prior to application to the non-linearity. Iterative application of the above techniques further improves performance.

BRIEF DESCRIPTION OF THE DRAWINGS

Referring now to the drawings in which like reference numbers represent corresponding parts throughout.

DETAILED DESCRIPTION OF PREFERRED EMBODIMENTS

In the following description, reference is made to the accompanying drawings which form a part hereof, and which is shown, by way of illustration, several embodiments of the present invention. It is understood that other embodiments may be utilized and structural changes may be made without departing from the scope of the present invention.

Figure 1:
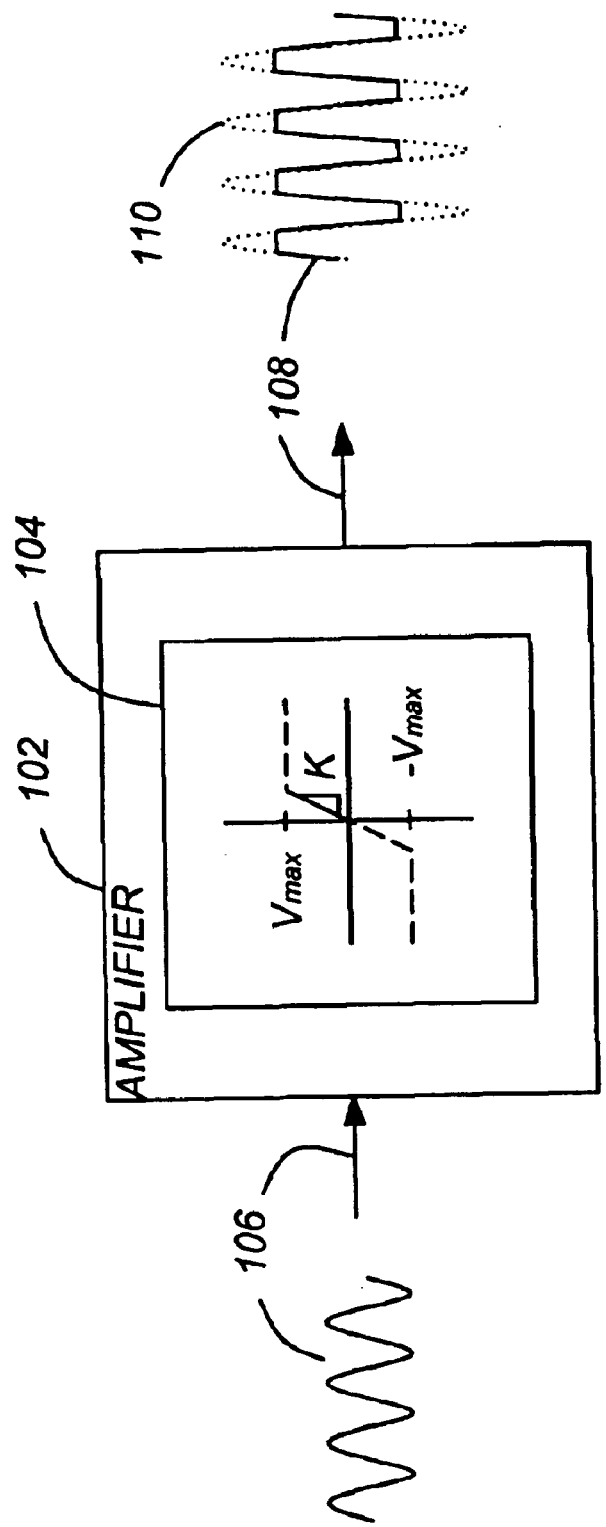
FIG. 1 is a diagram showing the operation of an amplifier.

FIG. 1 is a diagram showing the operation of an amplifier 102. The amplifier 102 manifests one or more non-linear input/output characteristics. One such non-linear characteristic is commonly referred to as a "clipping" or "saturation" non-linear characteristic 104, which is illustrated in FIG. 1. The illustrated nonlinear characteristic 104 is one in which the output signal 108 of the amplifier 102 is limited to $\pm V_{max}$. Hence, when the input signal 106 is such that when amplified by gain K; the output signal 108 would exceed $\pm V_{max}$, the output signal 108 becomes clipped to $\pm V_{max}$ as shown. Signal 110 shows the output signal without clipping. Amplifier 102 includes any device which performs an amplification function, including, for example, a radio-frequency (RF) transmitter on board a satellite.

As described above, multi-carrier signals often include high peak-to-average power ratios (PAR). When provided to an amplifier, transmitter, or other device with a clipping non-linearity characteristic, spectral distortion (such as intermodulation distortion) is often the result.

Figure 2:
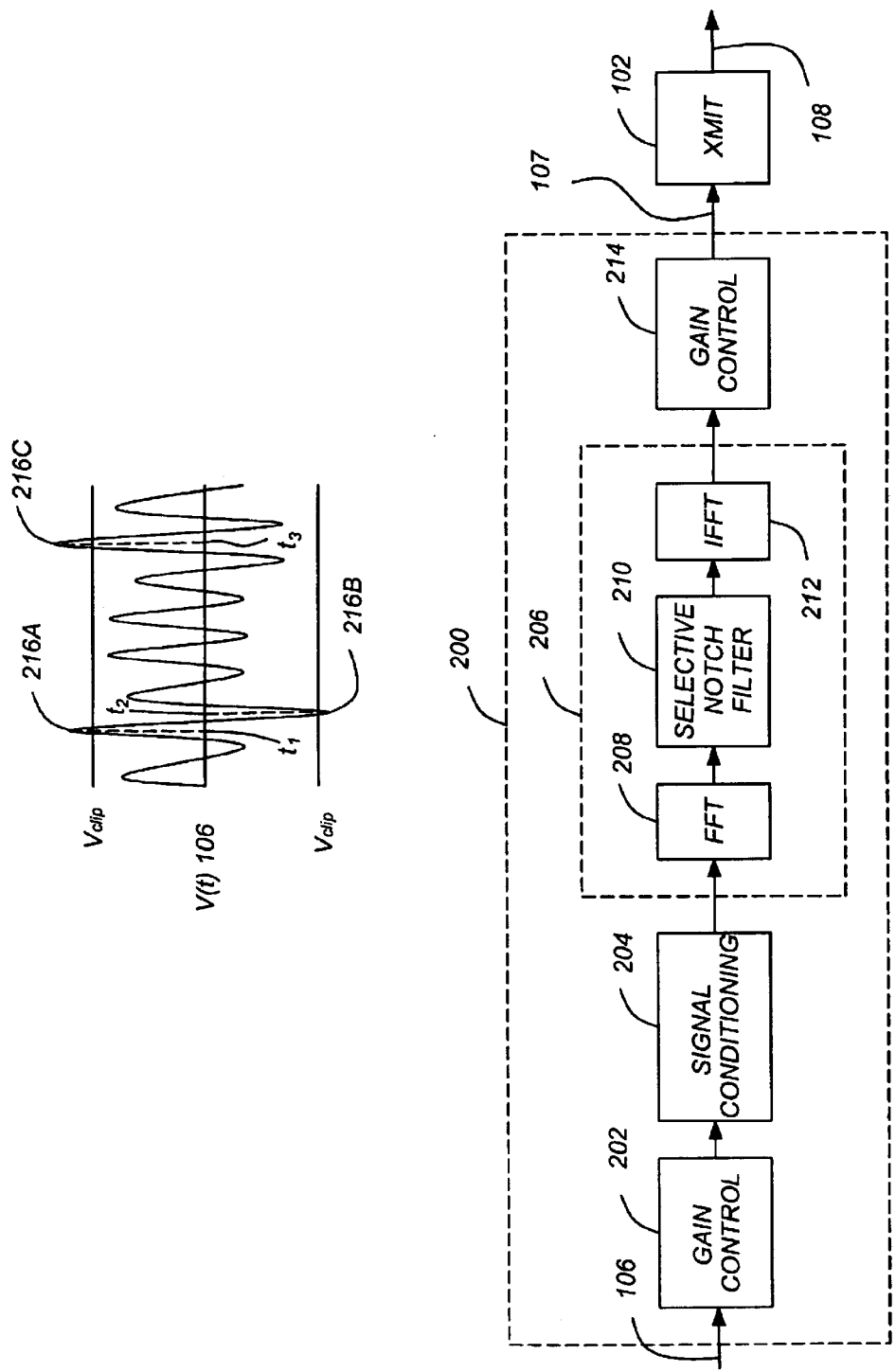
FIG. 2 is a block diagram showing one embodiment of a signal processor used to reduce amplifier clipping and the spectral distortion resulting therefrom.
Figure 3A:
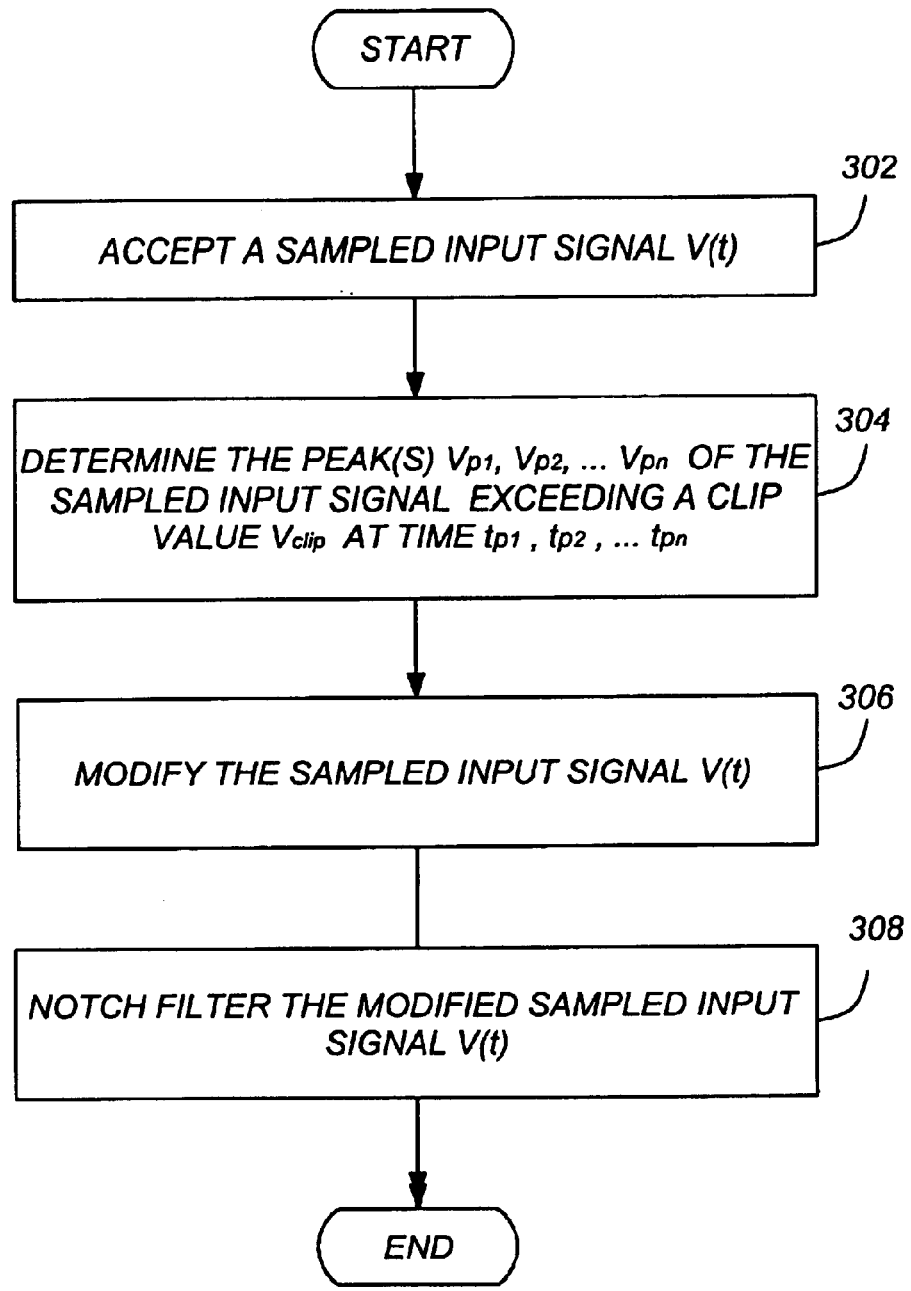
FIGS. 3A–3B are flow charts illustrating exemplary process steps that can be used to practice one embodiment of the present invention.
Figure 3B:
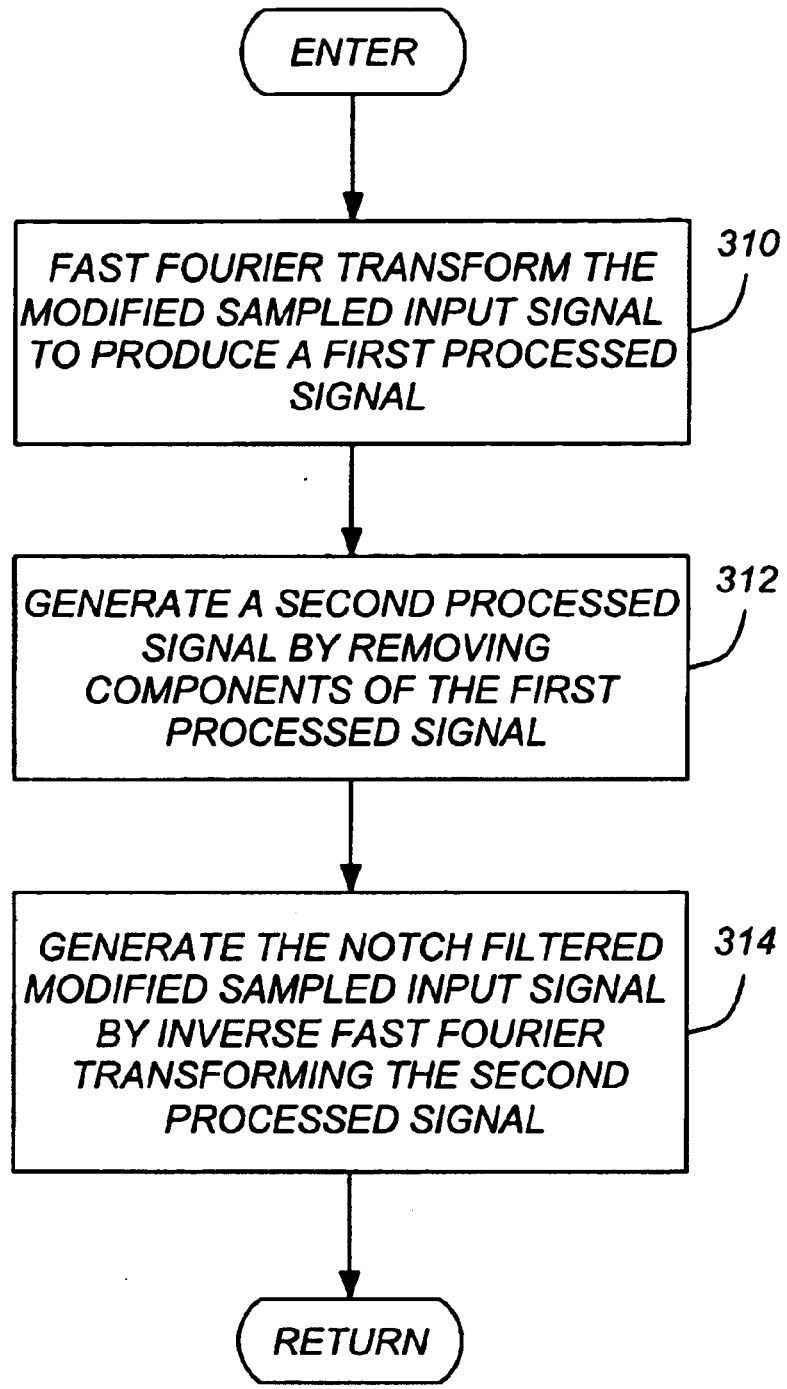

FIG. 2 is a block diagram showing one embodiment of a signal processor 200 used to reduce amplifier 116 clipping and the spectral distortion resulting therefrom FIGS. 3A–3B are flowcharts illustrating exemplary process steps that can be used to practice one embodiment of the present invention.

Referring now to FIGS. 2 and 3A–3B, and a sampled input signal V(t) 106 is accepted, as shown in block 302. The input signal V(t) 106 may comprise a plurality of peaks $V_{p_1}$, $V_{p_2}$, ..., $V_{p_n}$ 216A-216C that exceed a clip value $V_{clip}$ 218 at times $t_1, t_2, ..., t_n$, respectively.

The sampled input signal V(t) is modified. In one embodiment, this is accomplished by weighting the n peaks $V_{p_1}, V_{p_2}, ..., V_{p_n}$ exceeding the clip value $V_{clip}$ 218 by use of a function b(t) as described in Equation (1) below:

$$\tilde{V}(t)=V(t)\cdot b(t) \quad \text{Equation (1)}$$

wherein b(t) can either be a hard limiting function or a shaping function of the general form:

$$b(t)=f(a_1,a_2,\ldots a_n; t-t_{p_1}, t-t_{p_2}, \ldots t-t_{p_n}) \quad \text{Equation (2)}$$

wherein $a_1, a_2, \ldots a_n$ are weight values corresponding to the n peaks $V_{p_1}, V_{p_2}, \ldots, V_{p_n}$, and $f(t-t_{p_1}, t-t_{p_2}, \ldots t-t_{p_n})$ is a smooth (e.g. continuously non-singular) shaping function. This is illustrated in block 306.

In one embodiment, the function b(t) is a hard limiting function that "pre-clips" the n peaks $V_{p_1}, V_{p_2}, \ldots, V_{p_n}$ 216A-216C to a threshold value $V_{clip} < V_{max}$. The threshold value can be user-selected, and is preferably selected to be approximately 0.5 dB lower than the nominal linearized maximum output $V_{max}$ of the amplifier 102. The term "pre-clip", as used herein, refers to clipping of the input signal V(t) 106 (before or after the application of the gain control 202 and is to be distinguished from the undesired effect of the amplifier 102 clipping illustrated in FIG. 1.

In another embodiment, the function b(t) comprises a series of inverted Gaussian-shaped pulses, each centered at the time corresponding to the peak values $V_{p_1}, V_{p_2}, \ldots, V_{p_n}$ of the input signal V(t).

Figures 4A, 4B:
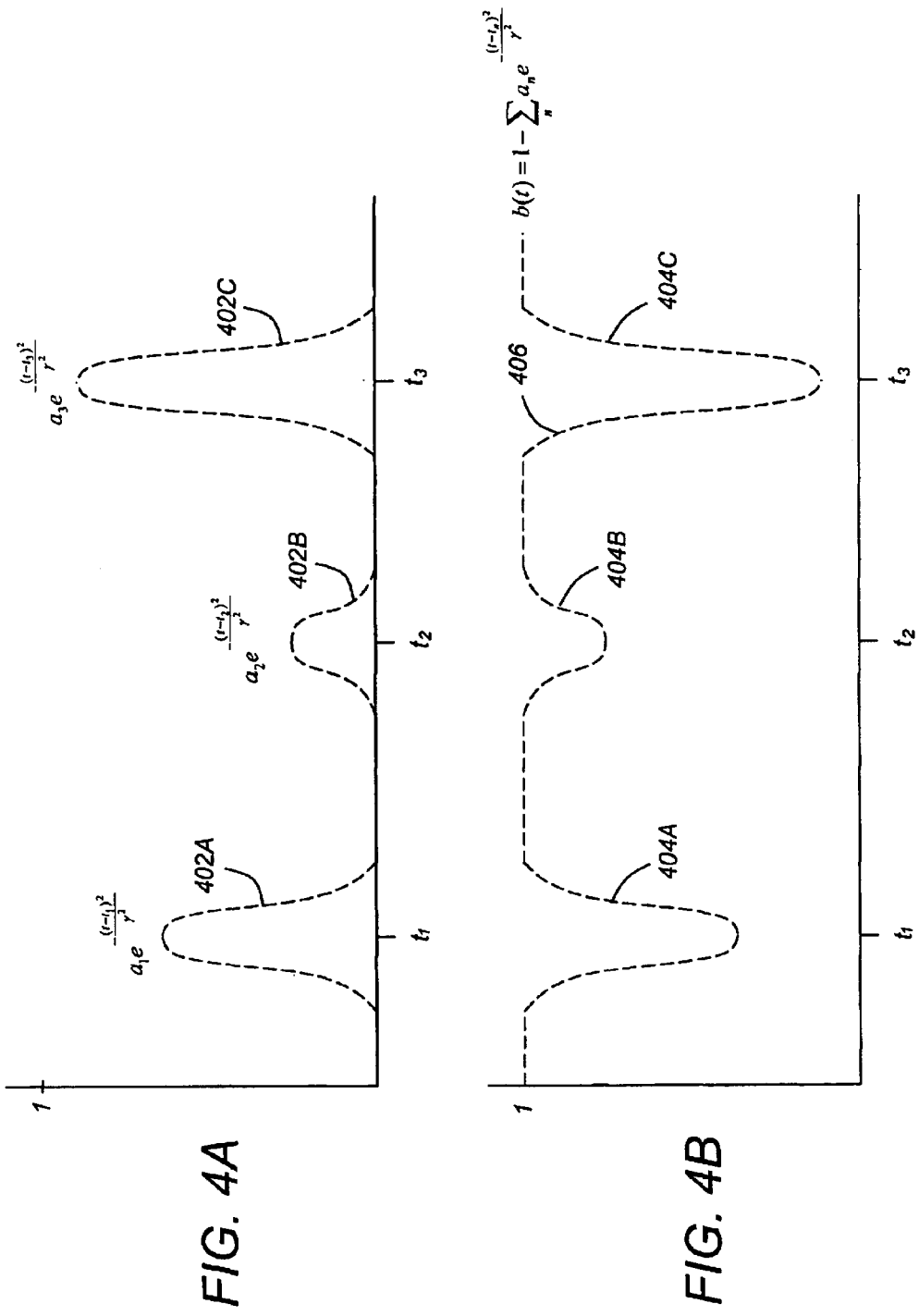
FIGS. 4A and 4B are diagrams illustrating the generation of a series of inverted Gaussian-shaped pulses.

FIGS. 4A and 4B are diagrams illustrating the generation of a series of inverted Gaussian-shaped pulses. FIG. 4A is a diagram presenting a series of Gaussian shaped pulses 402A-402C Pulses one, two, and three 402A, 402B, and 402C are centered at times $t_1, t_2$, and $t_3$, respectively. Each pulse 402 is a Gaussian shaped pulse generally described in the form of $a_n e$ $$a_n e^{\frac{(t-t_n)^2}{r^2}}.$$

As shown in FIG. 4B, shaping function b(t) can be formed from pulses 402A-402C by subtracting the sum of the pulses from unity, as described in Equation (3) below:

$$b(t) = 1 - \sum_n a_n e^{\frac{(t-t_n)^2}{r^2}} \quad \text{Equation (3)}$$

wherein $t_n$ is the center of each Gaussian pulse, and γ is a factor proportional to the width of each Gaussian pulse. In the illustrated example, each of the pulses 402A–402C have the same width. This results in the smooth shaping pulses 404A–404C. When b(t) is multiplied by the input waveform V(t), the smoothed shaping pulses of b(t) attenuate the peaks in the input signal V(t) before it is provided to the amplifier 102.

The weight values $a_1, a_2, \ldots, a_n$ can be selected according to Equation (4) below:

$$a_n = 1 - \frac{V_{clip}}{V_{p_n}} \quad \text{Equation (4)}$$

The preferred value of $V_{clip}$ should be set slightly below the maximum input that can be provided to the amplifier without clipping with $V_{clip} < V_{max}$.

Using the relationships described in Equations (1)–(4), the modified input signal $\tilde{V}(t)$ becomes $$\tilde{V}(t) = V(t) \cdot \left(1 - \sum_n a_n e^{\frac{(t-t_n)^2}{r^2}}\right) \quad \text{Equation (5)}$$

The operations described in blocks 304 and 306 can be performed by the input signal conditioning module 204 shown in FIG. 2, which pre-clips or shapes the input waveform as desired. Optional gain control module 202 can be used to attenuate or amplify the input signal V(t) 106 before the digital shaping process is undertaken.

The Gaussian shaped pulses served to reduce input signal peaks to below the threshold level $V_{clip}$. Further, because the Gaussian-shaped pulses extend smoothly in either direction (i.e. without singularities, piecewise nonlinearities, or other excessive derivatives), the foregoing adjusts the amplitude of the peaks in a way that mimes undesirable aftereffects.

In the preferred embodiment, each of the peaks 216A–216C are individually examined, and an appropriate shaping function is applied, beginning with the largest peak 216C, and moving to each successive smaller peak (e.g. 216B and 216A) of the input signal V(t) 126. For example, peak 216C can be identified, and a shaping function for peak 216C can be determined first (in the above example, the notch function is described by $t_3, a_3$, and y). Next., peak 216A is identified, and a shaping function (e.g. values for $t_1$, $a_1$, and y) is determined. Then, this smallest peak, peak 216B is identified, and a shaping function is determined for this peak as well.

Alternatively, all peaks 216A–216C can be identified, and the appropriate parameters for each shaping function chosen by considering the parameters of all the peaks 216A–216C For example, peak 216A–216C can be identified, along with the appropriate times $t_1$, $t_2$, and $t_3$, and the values of $a_1$, $a_2$, and $a_3$ determined from the parameters of all the peaks. In this case, it may be appropriate to select different values for the width of the shaping function (e.g. different values for y) to be identified and applied.

The foregoing techniques produce undesirable spectral components, which can be notch filtered selectively. Returning to FIG. 3A, the modified sampled input signal $\tilde{V}(t)$ 205 is notch filtered, as shown in block 308. This can be accomplished by the notch filtering system 206 shown in FIG. 2.

FIG. 3B is a flow chart presenting illustrative process steps that can be used to notch filtered the modified sampled input signal $\tilde{V}(t)$ 205. In block 310, the modified sampled input signal $\tilde{V}(t)$ 205 is a fast Fourier transformed, or FFTed, to provide a first process signal. This can be accomplished, for example by FFT module 208. The first process signal is a frequency domain representation of $\tilde{V}(t)$ 205, (e.g. $\tilde{V}(\omega)$) and has a plurality of spectral components.

Next, some or all of the spectral components are substantially attenuated or removed to produce a second processed signal $\tilde{V}_{nf}(\omega)$, as illustrated in block 312. This can be accomplished, for example, by the selective notch filter 210 shown in FIG. 2. In one embodiment, spectral components that are substantially attenuated or removed are intermodulation spectral components. The selection, and substantial attenuation or removal of components can be accomplished by expressing the spectrum of the second processed signal as the frequency content in a plurality of "bins", wherein each "bin" holds the frequency content between two closely-spaced frequencies. Then, the second processed signal $\tilde{V}_{nf}(\omega)$ is inverse fast Fourier transformed IFFTed) to produce the notch filtered modified sampled input signal $\tilde{V}_{nf}(t)$, as shown in block 314. This can be performed, for sample, by IFFT module 212.

If desired, the gain of the notch filtered signal $\tilde{V}_{nf}(\omega)$ can be further adjusted by second gain control module 214. The first gain control module 202 and a second gain control module 214 can be used together to adjust the gain of the signal that is digitally shaped and selectively notch filtered, and to readjust the gain of the signal after such processing is completed.

Figure 5A:
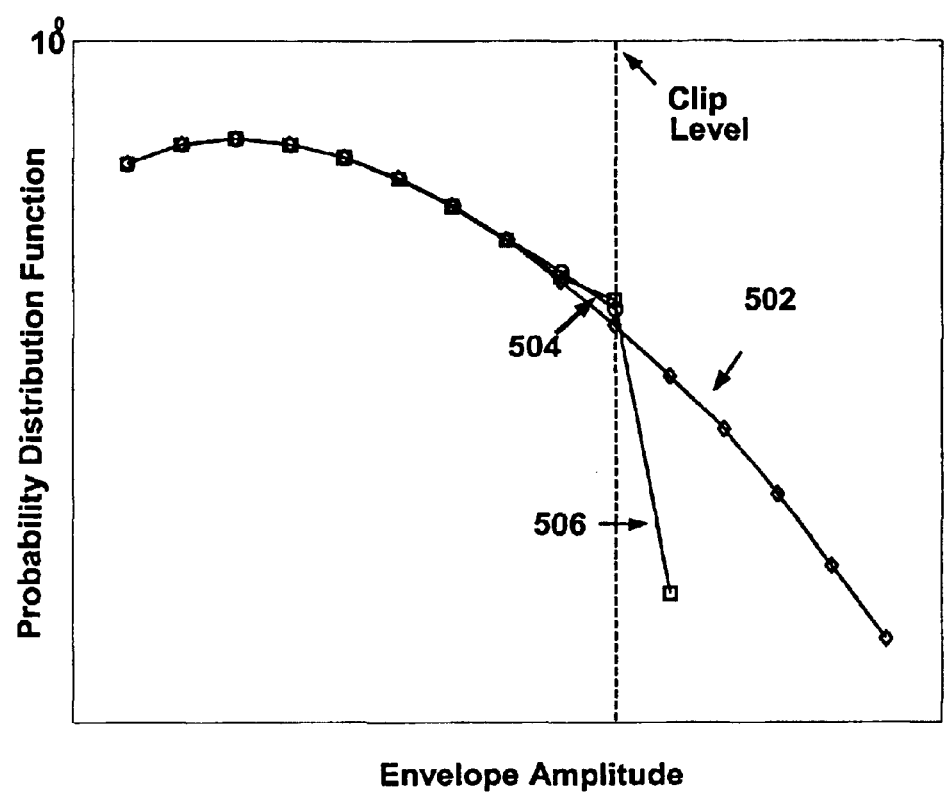
FIG. 5A is a diagram presenting the peak-to-RMS (PAR) level of the output signal $\tilde{V}_{nf}(t)$ of the signal processor before and after application of the clip and notch filtering technique described herein.

FIG. 5A is a diagram comparing the Peak-to-RMS (PAR) level of the output signal $\tilde{V}_{nf}(t)$ of the signal processor 200 using input pre-clipping and notch filtering with a 6.5 dB output back-off. Plot 502 is a plot of the probability distribution as a function of the amplitude of the envelope of the signal input to the amplifier 102 without preprocessing. Plot 504 is a plot of the probability distribution using input pre-clipping alone. Plot 506 is a plot of the probability distribution using input pre-clipping and notch filtering. Note that input pre-clipping and notch filtering significantly reduces peak to RMS (PAR) level of multi-carrier signal.

Figure 5B:
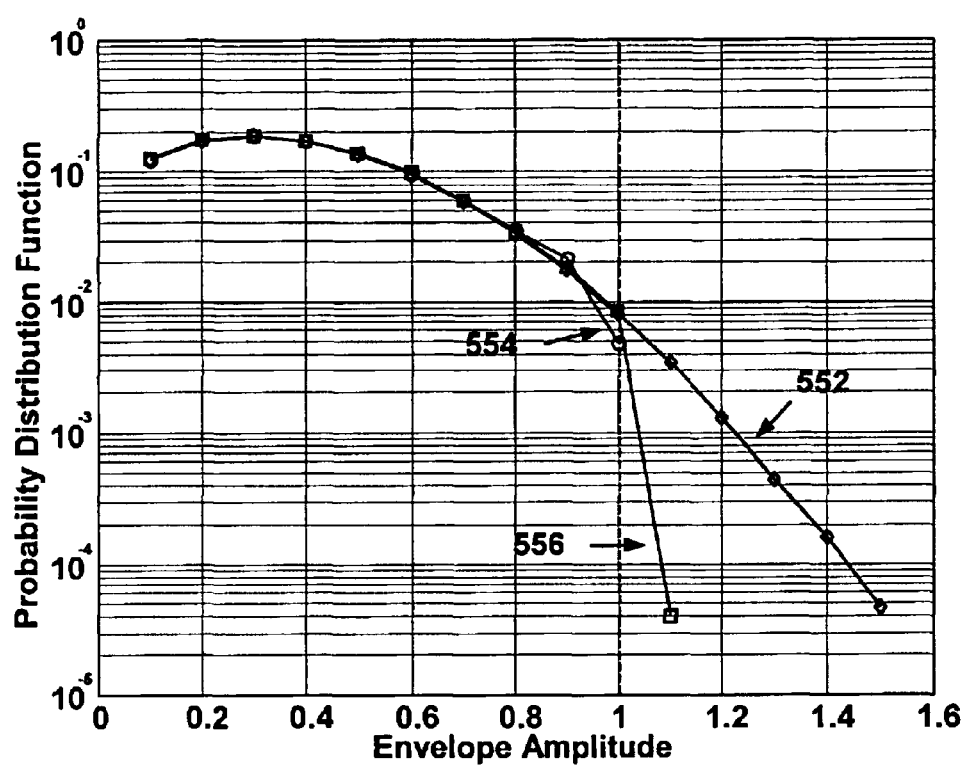
FIG. 5B is a diagram presenting the peak-to-RMS (PAR) level of the output signal $\tilde{V}_{nf}(t)$ of the signal processor before and after application of the shape and notch filtering technique described herein.

FIG. 5B is a diagram comparing the Peak-to-RMS (PAR) level of the output signal $\tilde{V}_{nf}(t)$ of the signal processor 200 using input shaping and notch filtering. Plot 552 is a plot of the probability distribution as a function of the amplitude of the envelope of the signal input to the amplifier 102 without preprocessing. Plot 554 is a plot of the probability distribution using input shaping alone. Plot 556 is a plot of the probability distribution using input shaping and notch filtering. Note that input shaping and notch filtering substantially reduce the probability that the waveform is greater than one, while having negligible effect on envelope amplitudes less than one.

Figure 6A:
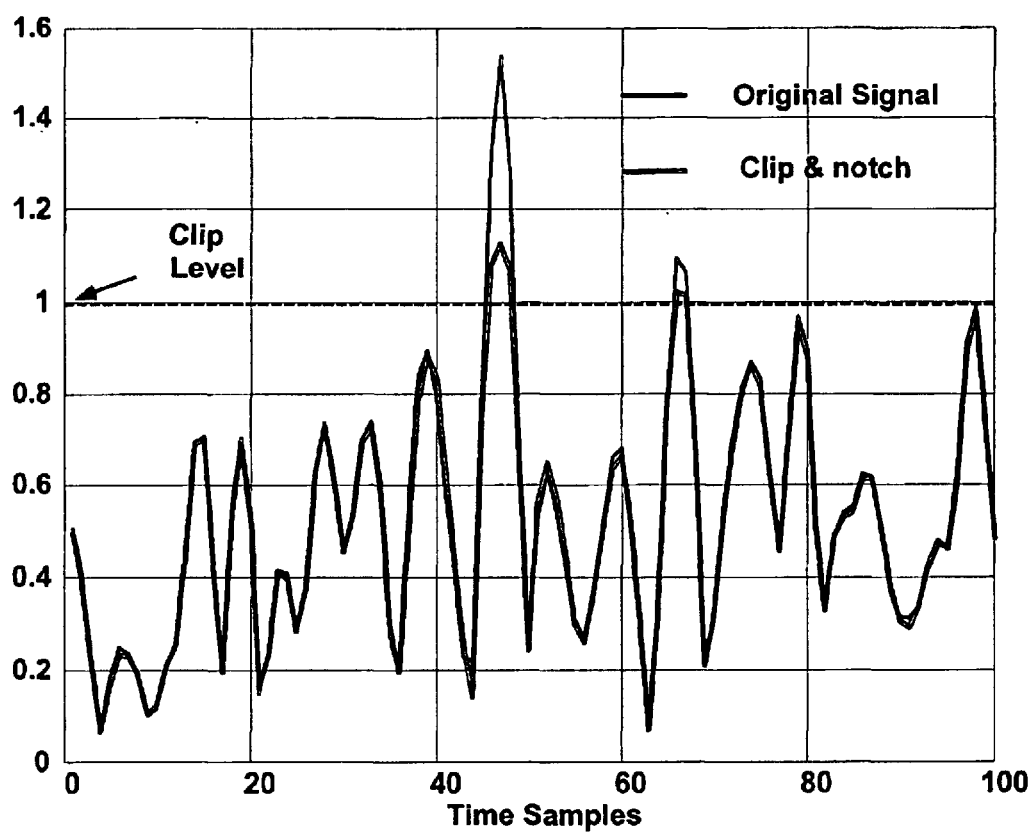
FIG. 6A is a diagram showing the effect of the clip and notch technique in reducing multi-carrier signal peaks to below threshold levels.

FIG. 6A is a diagram showing the effect of the pre-clip and notch technique in reducing multi-carrier signal peaks to below threshold levels.

Figure 6B:
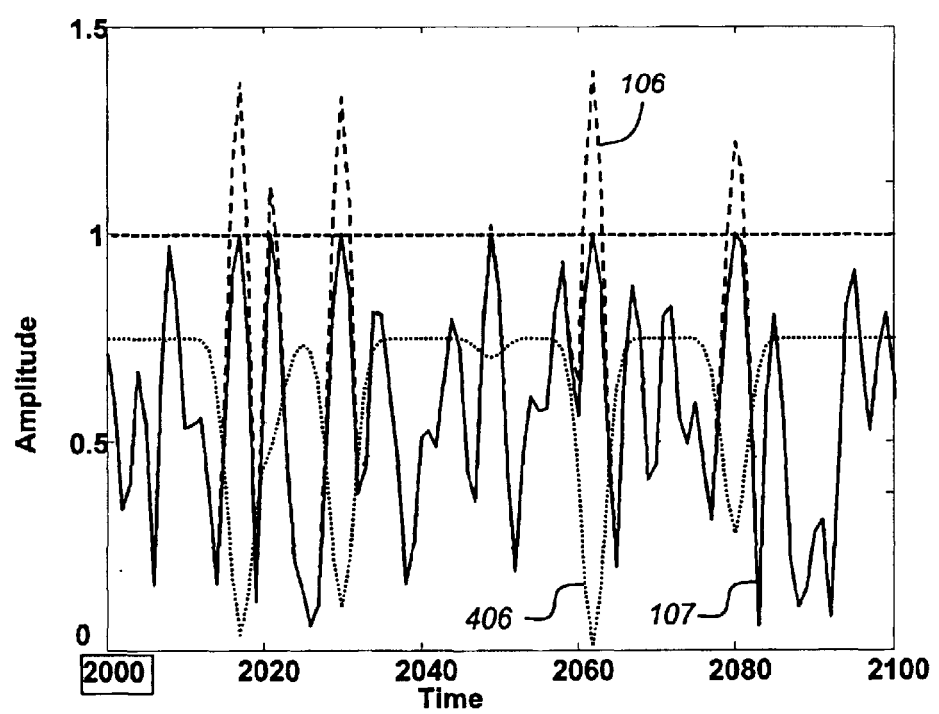
FIG. 6B is a diagram showing the effect of the shape and notch technique in reducing multi-carrier signal peaks to below threshold values.

FIG. 6B is a diagram showing the effect of the shape and notch technique in reducing multi-carrier signal peaks to below threshold values. The first plot, shows a time history of the input signal V(t) 106. The second plot 406 shows a time history of the smooth shaping function 406, which is applied to the input signal V(t) 106. The final plot shows the signal processor 200 output after application of the shaping and notching techniques described above.

Figure 7A:
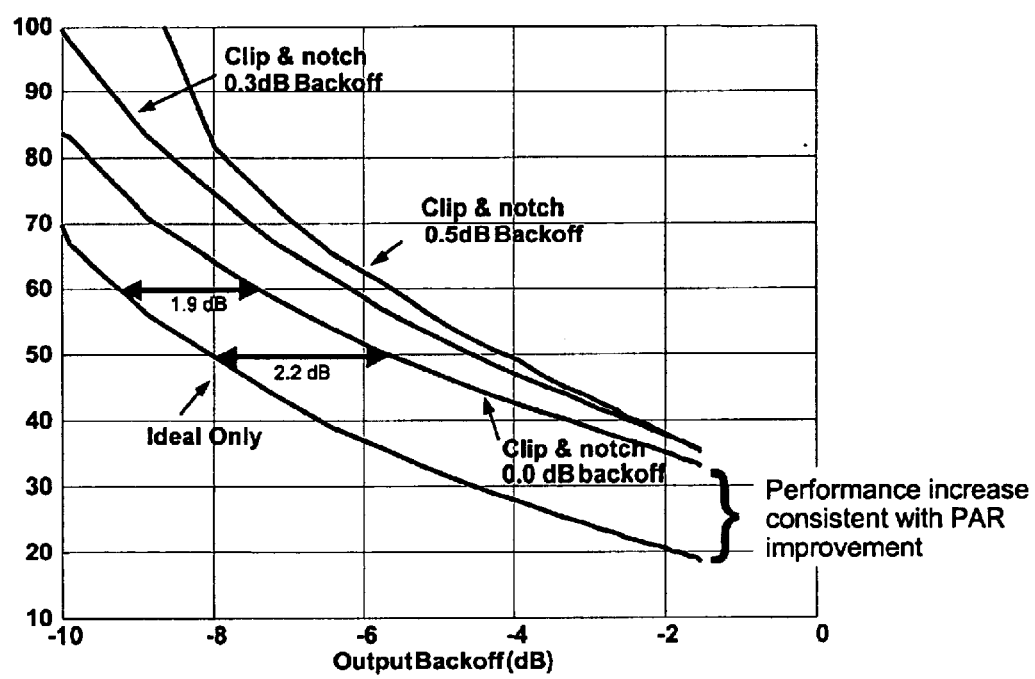
FIG. 7A is a diagram showing the effect of the clip and notch technique on improving carrier to interference (C/I) performance.

FIG. 7A is a diagram showing the effect of the pre-clip and notch technique on improving carrier to interference (C/I) performance. The lowest curve in FIG. 7A shows the theoretical minimum distortion one could expect without using the clip and notch technique. When applied to narrow portions of the frequency spectrum the application of this technique results in performance similar to theory but at much higher drive levels. For example, approximately 2.2 dB more output power can be obtained, as shown by the second lowest curve in FIG. 7A.

Figure 7B:
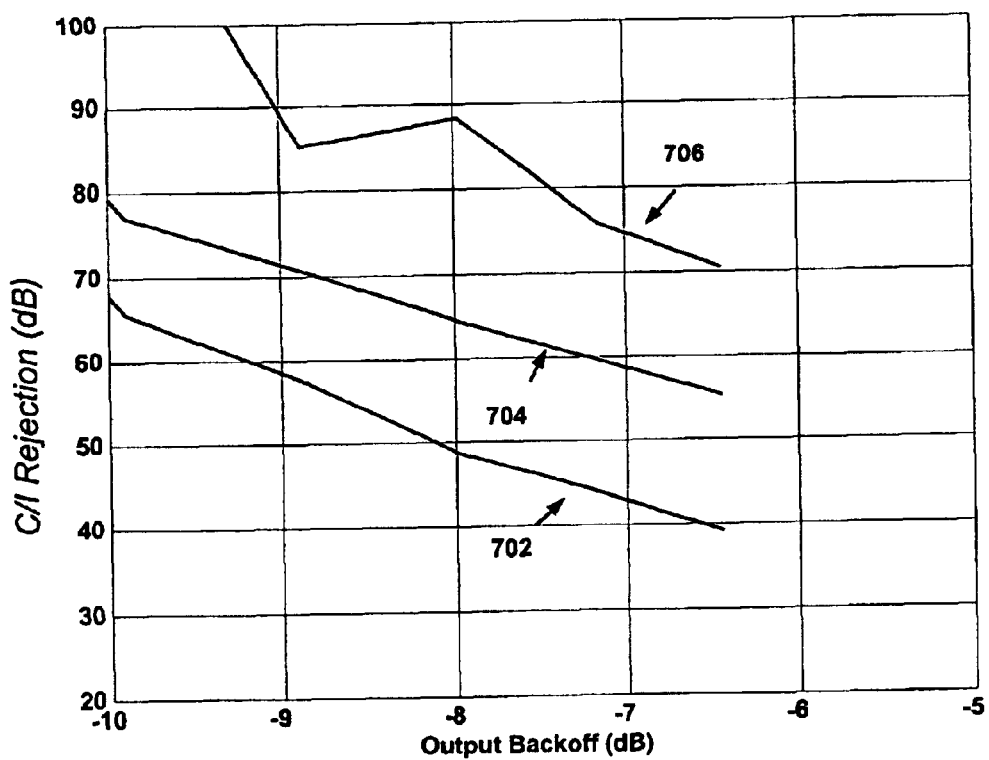
FIG. 7B is a diagram showing the effect of the shape and notch technique on improving carrier to interference (C/I) performance.

FIG. 7B is a diagram showing the effect of the present invention on improving carrier to interference (C/I) performance. Plot 702 shows the theoretical C/I performance as a function of output back off (dB) without using the technique of the present invention. Note that C/I rejection improves as the output back off increases. Plot 704 shows the C/I performance as a function of output backoff using the shape and notch techniques described above. When applied to narrow portions of the frequency spectrum, plot 704 shows that the C/I performance is similar to that which is obtainable in theory, but at much higher (~2 dB greater) drive levels. Any undesirable spectral components due to notching can further be reduced with additional backoff with gain control 202. Plot 706 shows the C/I performance as a function of output backoff using the shape and notch techniques described above, and also with an input backoff of 0.5 dB.

Figure 8:
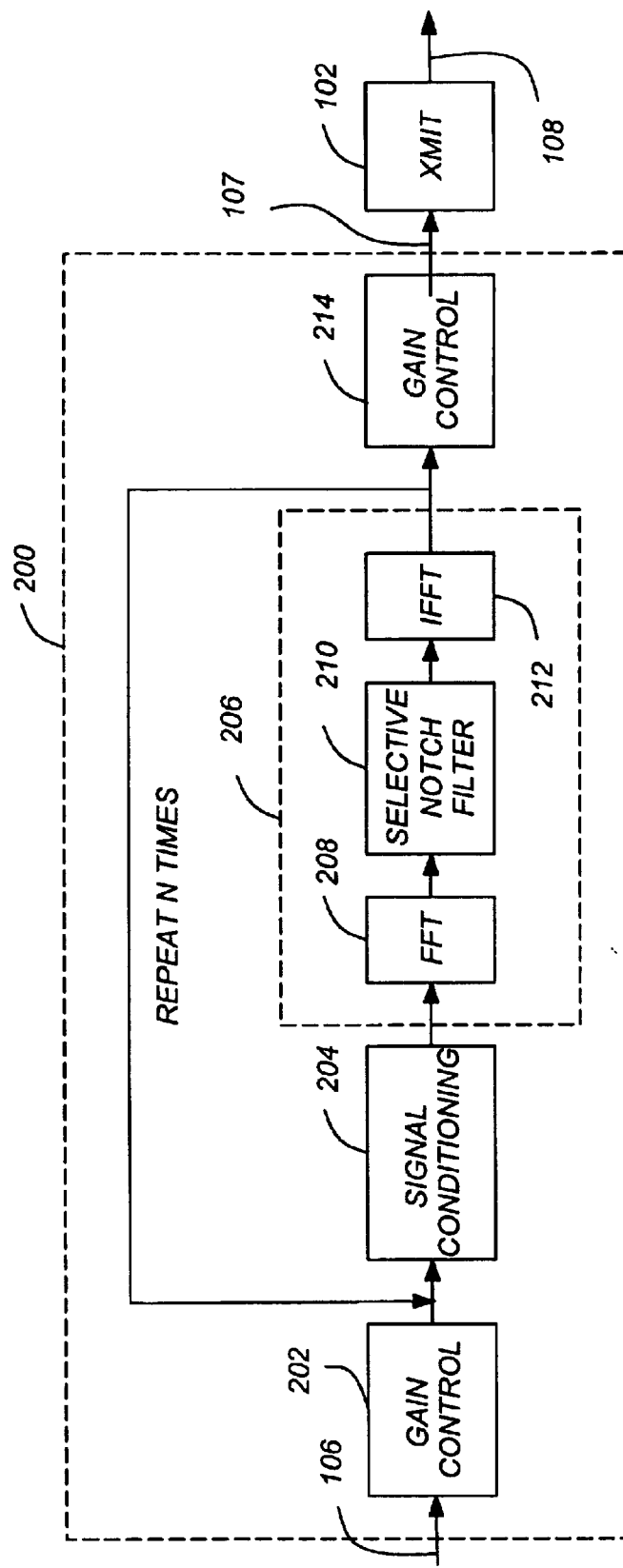
FIG. 8 is a diagram showing another embodiment of the present invention using an iterative technique.

FIG. 8 is a diagram showing another embodiment of the present invention. In this embodiment, a form of the "pre-clip and notch" technique described above is applied to the entire out-of-band spectrum, rather than selected bands as previously described. This permits significantly increased amplifier 102 drive levels and improved out of band intermodulation performance, while only slightly degrading in-band bit error rate (BER) performance. This allows an increase in overall power efficiency, thereby simplifying the amplifier's thermal control and power subsystems, or alternatively, allowing the addition of more amplifiers 102 four higher system data throughput.

Referring now to FIG. 8, the signal processor 800 includes the same modules that were discussed in connection with FIG. 2. However, the signal processor 800 shown in FIG. 8 includes additional iterative processing that results in further performance improvements. In the embodiment discussed above, only selected non-carrier frequency components (intermodulation spectral components) were selected for removal or substantial attenuation. In this embodiment however all undesired intermodulation components in the non-carrier frequency bands are substantially attenuated or removed by notch filtering. Further, after notch filtering, the result is again applied to the pre-clipping module 204, for further shaping and notch filtering. This process is repeated for N iterations.

Figure 9:
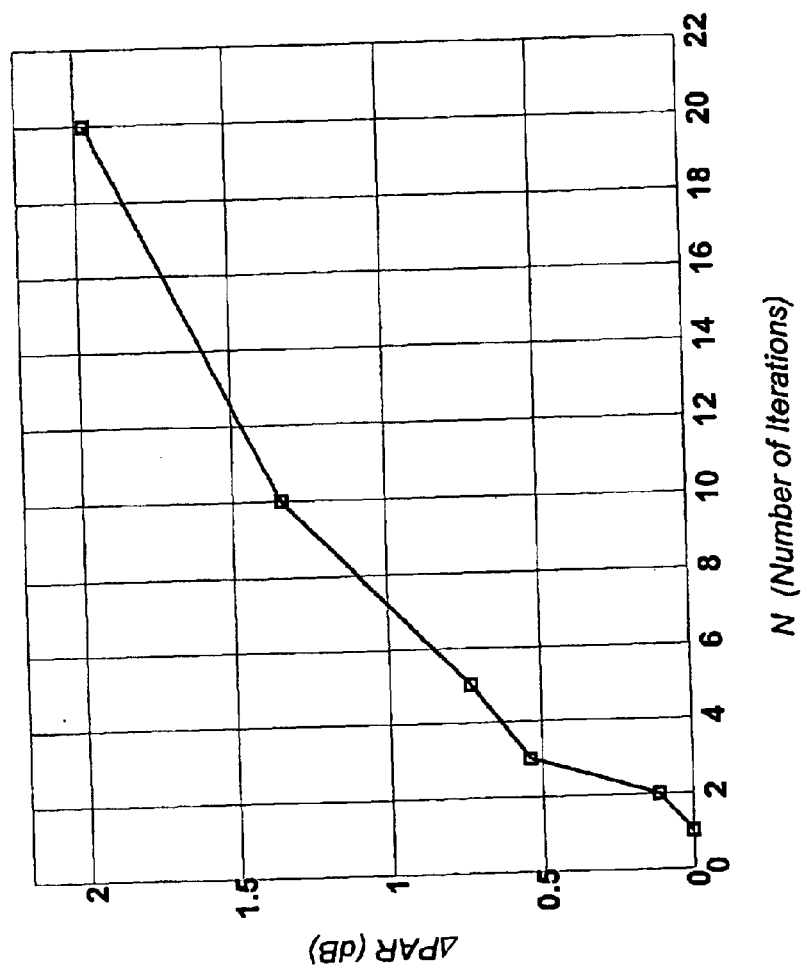
FIG. 9 is a diagram showing the reduction in peak-to-RMS ratio (PAR), or ΔPAR, of the composite envelope as a function of the number of iterations N.

FIG. 9 is a diagram showing the reduction in peak-to-RMS ratio (PAR), or ΔPAR, of the composite envelope as a function of the number of iterations N. Note that as the number of iterations N increases, ΔPAR of the composite envelope increases as well At 20 iterations, ΔPAR is approximately 2 dB.

Figure 10:
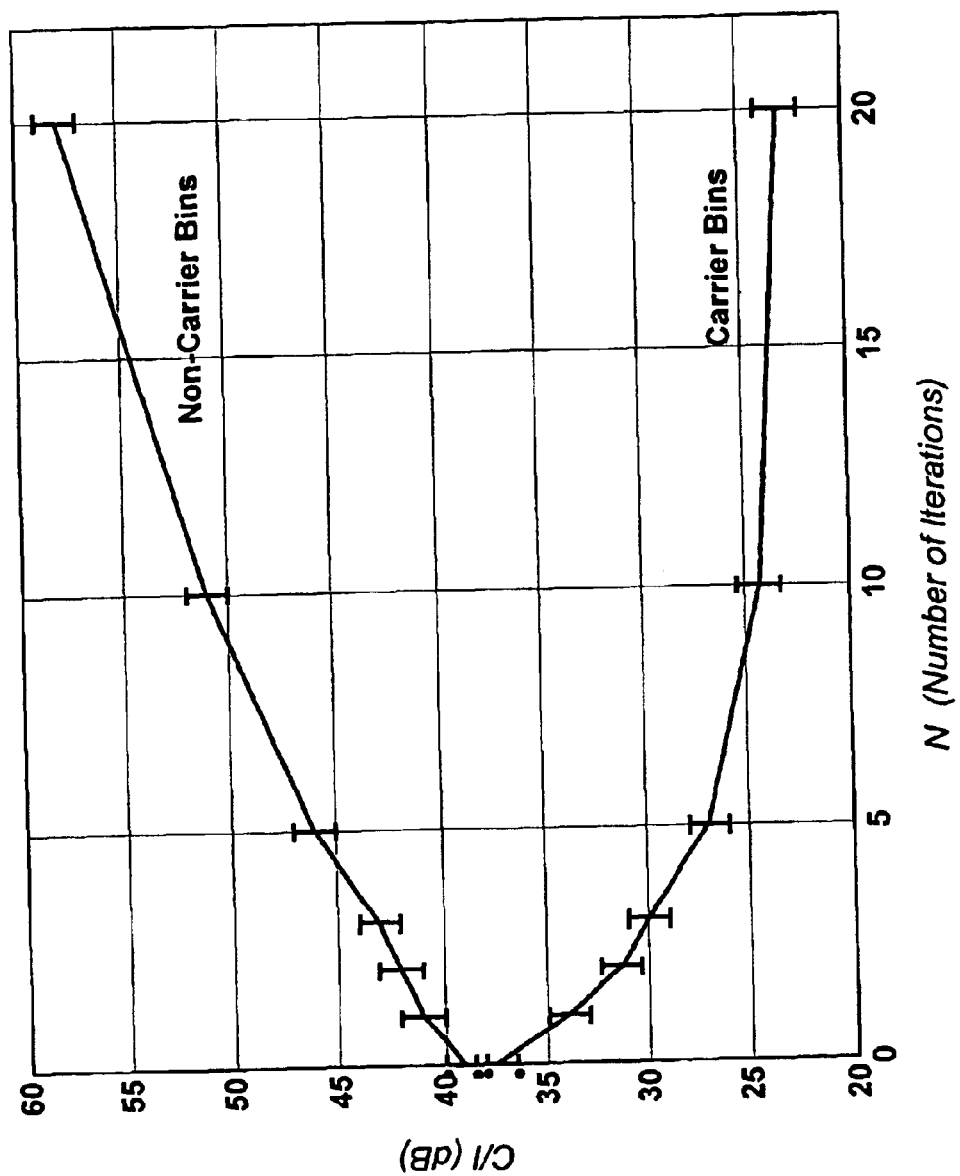
FIG. 10 is a diagram showing the relationship between the C/I ratio and the number of iterations N.

FIG. 10 is a diagram showing the relationship between the C/I ratio and the number of iterations N. Note that the C/I improves from 39 to 58 dB, while the C/I ratio is degraded from approximately 37 to 23 dB. In effect, interference power is moved from the non-carrier bins to the carrier bins. For typical waveforms, this degradation will have negligible degradation to overall BER.

Figure 11:
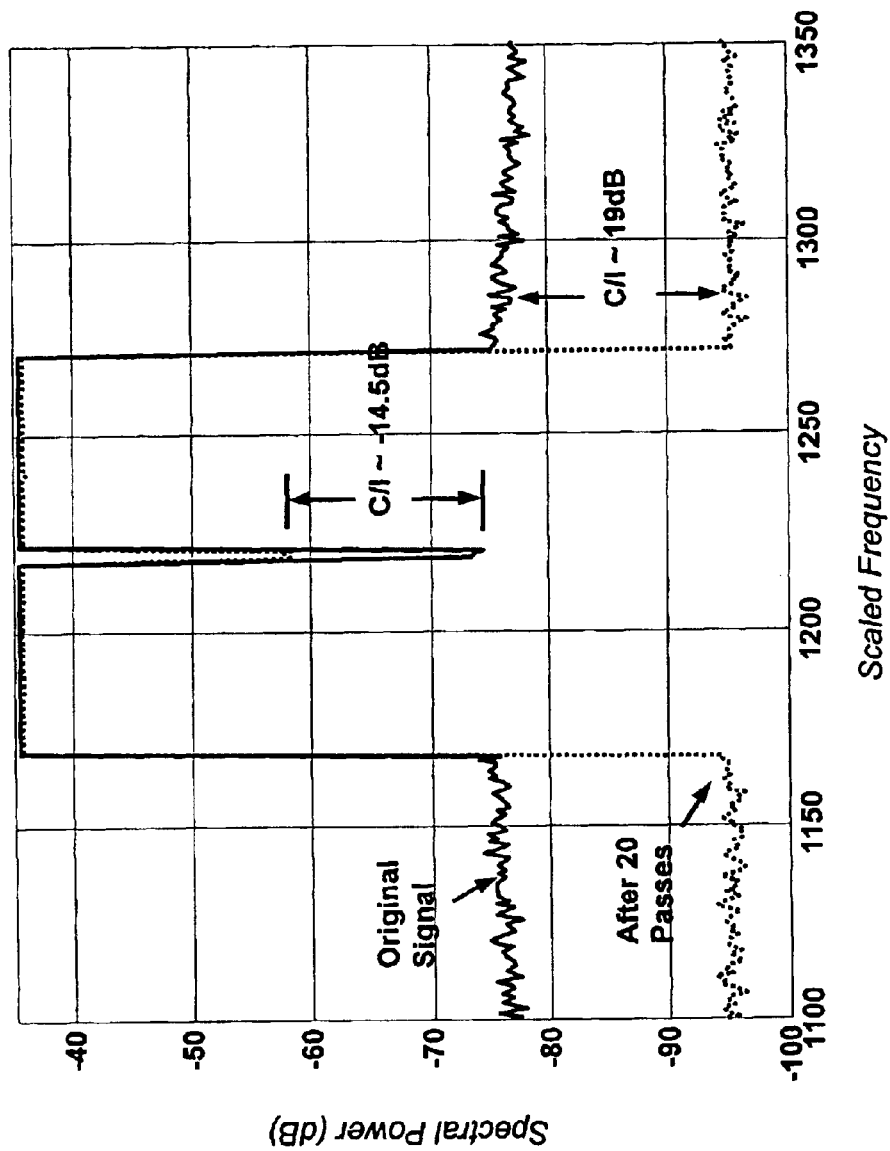
FIG. 11 is a diagram showing the spectral power of the signal before and after iterative application of the intermodulation-reducing techniques described above.

FIG. 11 is a diagram showing the spectral power of the signal before and after iterative application of the "pre-clip and notch" techniques described above. The C/I ratio in the non-carrier frequency bin is increased by ~19 dB after 20 iterations. This increase is at the expense of a degradation of C/I ratio of ~14.5 dB in the carrier bin.

CONCLUSION

This concludes the description of the preferred embodiments of the present invention. The foregoing description of the preferred embodiment of the invention has been presented for the purposes of illustration and description. It is not intended to be exhaustive or to limit the invention to the precise form disclosed. Many modifications and variations are possible in light of the above teaching. For example, while the present invention has been described with respect to amplifier applications, the present invention can be used with a wide variety of devices other than amplifiers. In particular, the present invention can be applied to reduce distortion components and other devices.

It is intended that the scope of the invention be limited not by this detailed description, but rather by the claims appended hereto. The above specification, examples and data provide a complete description of the manufacture and use of the composition of the invention. Since many embodiments of the invention can be made without departing from the spirit and scope of the invention, the invention resides in the claims hereinafter appended.

What is claimed is:

1. A method of reducing intermodulation distortion, comprising the steps of:
   (a) accepting a sampled input signal V(t) wherein the input signal V(t) comprises a plurality of peaks;
   (b) determining n peaks $V_{p_1}, V_{p_2}, \ldots, V_{p_n}$ of the sampled input signal V(t) exceeding a clip value $V_{clip}$ at times $t_1, t_2, \ldots, t_n$; and
   (c) modifying the sampled input signal V(t); and
   (d) notch filtering the modified sampled input signal V(t) to remove intermodulation components of the modified sampled input signal V(t).

2. The method of claim 1, wherein the step of modifying the sampled input signal V(t) comprises the step of weighting the n peaks $V_{p_1}, V_{p_2}, \ldots, V_{p_n}$ exceeding the clip value $V_{clip}$ of the sampled input signal V(t) by b(t)=f($a_1, a_2, \ldots a_n; t-t_{p_1}, t-t_{p_2}, \ldots, t-t_{p_n}$), wherein $a_1, a_2, \ldots a_n$ are weight values corresponding to the n peaks $V_{p_1}, V_{p_2}, \ldots, V_{p_n}$ and f($t-t_{p_1}, t-t_{p_2}, \ldots t-t_{p_n}$) is a smooth shaping function.

3. The method of claim 2, wherein the function b(t) comprises a Gaussian density function.

4. The method of claim 3, wherein the function b(t) comprises $$1 - \sum_n a_n e^{\frac{(t-t_n)^2}{\gamma^2}},$$

and wherein γ describes a width of the Gaussian density function.

5. The method of claim 2, wherein $$a_n = 1 - \frac{V_{clip}}{V_{p_n}}.$$

6. The method of claim 1, wherein the function b(t) comprises a hard limiting function.

7. The method of claim 1, wherein the step of notch filtering the modified sampled input signal V(t) to remove intermodulation components of the modified sampled input signal V(t) comprises the steps of:
   (d1) transforming the modified sampled input signal V(t) into a frequency domain representation having a plurality of intermodulation components;
   (d2) removing the intermodulation components; and
   (d3) transforming the frequency domain representation without the intermodulation components to a time domain.

8. The method of claim 1, wherein the step of notch filtering the modified sampled input signal V(t) to remove intermodulation components of the modified sampled input signal V(t) comprises the steps of:
   (d1) fast Fourier transforming the modified sampled input signal V(t) to produce a first processed signal;
   (d2) generating a second processed signal by removing the intermodulation components of the first processed signal; and
   (d3) generating the notch filtered modified sampled input signal V(t) by inverse fast Fourier transforming the second processed signal.

9. The method of claim 1, wherein:
   the sampled input signal V(t) comprises a plurality of carriers, collectively having carrier components in a frequency domain; and
   wherein the method further comprises the step of notch filtering the modified sampled input signal V(t) to remove the non-carrier components.

10. The method of claim 9, wherein the step of notch filtering the modified sampled input signal V(t) to remove the non-carrier components comprises the steps of:
    (d1) transforming the modified sampled input signal V(t) into a frequency domain representation having the carrier components and the non-carrier components;
    (d2) removing all of the non-carrier components; and
    (d3) transforming the frequency domain representation carrier components to a time domain.

11. The method claim 10, wherein the function b(t) comprises a hard limiting function and the method further comprises the step of:
    iteratively repeating steps (c)–(d3).

12. The method of claim 9, wherein the step of notch filtering the modified sampled input signal V(t) to remove the non-carrier components comprises the steps of: fast Fourier transforming the modified sampled input signal V(t) to produce a first processed signal;
    generating a second processed signal by removing all of the non-carrier components of the first processed signal; and generating the notch filtered modified sampled input signal V(t) by inverse fast Fourier transforming the second processed signal.

13. An apparatus for reducing intermodulation distortion, comprising:
   a gain control module, for accepting a sampled input signal V(t) wherein the input signal V(t) comprises a plurality of peaks, for determining n peaks $V_{p_1}$, $V_{p_2}, \ldots, V_{p_n}$ of the sampled input signal V(t) exceeding a clip value $V_{clip}$ at times $t_1, t_2, \ldots, t_n$ and for determining a weight value $$a_n = 1 - \frac{V_{clip}}{V_{p_n}};$$

a signal conditioning module, for modifying the sampled input signal; and
   a notch filter, for filtering the modified sampled input signal V(t) to remove intermodulation components of the modified sampled input signal V(t).

14. The apparatus of claim 13, wherein the signal conditioning module weights the n peaks $V_{p_1}$, $V_{p_2}, \ldots, V_{p_n}$ exceeding the clip value $V_{clip}$ of the sampled input signal V(t) by a function $b(t)=f(a_1, a_2 \ldots a_n; t-t_{p_1}, t-t_{p_2}, \ldots t-t_{p_n})$, wherein $a_1, a_2, \ldots a_n$ are weight values corresponding to the n peaks $V_{p_1}, V_{p_2}, \ldots, V_{p_n}$ and $f(t-t_{p_1}, t-t_{p_2}, \ldots t-t_{p_n})$ is a smooth shaping function.

15. The apparatus of claim 14, wherein the function b(t) comprises a Gaussian density function.

16. The apparatus of claim 15, wherein the function b(t) comprises $$1 - \sum_n a_n e^{\frac{(t-t_n)^2}{\gamma^2}},$$

wherein γ describes a width of the Gaussian density function, and wherein $$a_n = 1 - \frac{V_{clip}}{V_{p_n}}.$$

17. The apparatus of claim 13, wherein the notch filtered comprises:
   a fast Fourier transform module;
   a frequency domain component editor module;
   an inverse fast Fourier transform module.

18. The apparatus of claim 17, wherein the input signal V(t) comprises a plurality of carriers.

19. The apparatus of claim 13, wherein the signal conditioning module comprises a hard limiter.

20. An apparatus for reducing intermodulation distortion, comprising the steps of:
   (a) means for accepting an input signal V(t) wherein the input signal V(t) comprises a plurality of peaks;
   (b) means for determining n peaks $V_{p_1}, V_{p_2}, \ldots, V_{p_n}$ of the input signal V(t) exceeding a clip value $V_{clip}$ at times $t_1, t_2, \ldots, t_n$; and
   (c) means for modifying the input signal V(t); and
   (d) means for notch filtering the modified input signal V(t) to remove intermodulation components of the modified input signal V(t).

21. The apparatus of claim 18, wherein the means for modifying the input signal V(t) weights the n peaks $V_{p_1}$, $V_{p_2}, \ldots, V_{p_n}$ exceeding the clip value $V_{clip}$ of the input signal V(t) by a function $b(t)=f(a_1, a_2, \ldots a_n; t-t_{p_1}, t-t_{p_2}, \ldots t-t_{p_n})$, wherein $a_1, a_2, \ldots a_n$ are weight values corresponding to the n peaks $V_{p_1}, V_{p_2}, \ldots, V_{p_n}$ and $f(t-t_{p_1}, t-t_{p_2}, \ldots t-t_{p_n})$ is a smooth shaping function.

22. The apparatus of claim 21, wherein the function b(t) comprises a Gaussian density function.

23. The apparatus of claim 22, wherein the function b(t) comprises $$1 - \sum_n a_n e^{\frac{(t-t_n)^2}{\gamma^2}},$$

and wherein γ describes a width of the Gaussian density function.

24. The apparatus of claim 21, wherein $$a_n = 1 - \frac{V_{clip}}{V_{p_n}}.$$

25. The apparatus of claim 20, wherein the means for notch filtering the modified input signal V(t) to remove intermodulation components of the modified input signal V(t) comprises:
   (d) means for transforming the modified input signal V(t) into a frequency domain representation having a plurality of intermodulation components;
   (e) means for removing the intermodulation components; and
   (f) means for transforming the frequency domain representation without the intermodulation components to a time domain.

26. The apparatus of claim 24, wherein the means for notch filtering the modified input signal V(t) to remove intermodulation components of the modified input signal V(t) comprises:
   (d) means for fast Fourier transforming the modified input signal V(t) to produce a first processed signal;
   (e) means for generating a second processed signal by removing the intermodulation components of the first processed signal; and
   (f) means for generating the notch filtered modified input signal V(t) by inverse fast Fourier transforming the second processed signal.

27. The apparatus of claim 20, wherein:
   the input signal V(t) comprises a plurality of carriers, collectively having carrier components in a frequency domain; and
   wherein the apparatus further comprises means for notch filtering the modified input signal V(t) to remove the non-carrier components.

28. The apparatus of claim 27, wherein the means for notch filtering the modified input signal V(t) to remove the non-carrier components comprises:
   (d) means for transforming the modified input signal V(t) into a frequency domain representation having the carrier components and the non-carrier components;
   (e) means for removing all of the non-carrier components; and
   (f) means for transforming the frequency domain representation carrier components to a time domain.

29. The apparatus of claim 27, wherein the means for notch filtering the modified input signal V(t) to remove the non-carrier components comprises:

means for fast Fourier transforming the modified input signal V(t) to produce a first processed signal;

means for generating a second processed signal by removing all of the non-carrier components of the first processed signal; and means for generating the notch filtered modified input signal V(t) by inverse fast Fourier transforming the second processed signal.

30. The apparatus of claim 20, wherein the means for modifying the input signal V(t) comprises means for hard limiting the input signal V(t).

* * * * *

UNITED STATES PATENT AND TRADEMARK OFFICE
CERTIFICATE OF CORRECTION

PATENT NO. : 6,922,103 B2
DATED : July 26, 2005
INVENTOR(S) : Peter Y. Cheung et al.

It is certified that error appears in the above-identified patent and that said Letters Patent is hereby corrected as shown below:

Column 1,
Line 46, "Mulit-Carrier" should read -- Multi-Carrier --.
Line 54, "pp1034-1038" should read -- pp. 1304-1308 --.

Column 6,
Line 50, "four" should read -- for --.

Signed and Sealed this

Twenty-fifth Day of October, 2005

JON W. DUDAS
*Director of the United States Patent and Trademark Office*